United States Patent
Fujii et al.

(10) Patent No.: US 10,381,192 B2
(45) Date of Patent: Aug. 13, 2019

(54) ION IMPLANTATION APPARATUS AND ION IMPLANTATION METHOD

(71) Applicant: TOSHIBA MEMORY CORPORATION, Minato-ku (JP)

(72) Inventors: Tsuyoshi Fujii, Kusatsu (JP); Takayuki Ito, Yokkaichi (JP); Yasunori Oshima, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/905,896

(22) Filed: Feb. 27, 2018

(65) Prior Publication Data
US 2019/0074158 A1 Mar. 7, 2019

(30) Foreign Application Priority Data

Sep. 4, 2017 (JP) .................. 2017-169742
Jan. 11, 2018 (JP) .................. 2018-002898

(51) Int. Cl.
*H01J 37/08* (2006.01)
*H01J 37/20* (2006.01)
*H01J 37/24* (2006.01)
*H01J 37/147* (2006.01)
*H01J 37/317* (2006.01)

(52) U.S. Cl.
CPC ............ *H01J 37/243* (2013.01); *H01J 37/08* (2013.01); *H01J 37/1477* (2013.01); *H01J 37/20* (2013.01); *H01J 37/3171* (2013.01); *H01J 2237/032* (2013.01); *H01J 2237/0473* (2013.01); *H01J 2237/20207* (2013.01)

(58) Field of Classification Search
CPC ...... H01J 37/243; H01J 37/08; H01J 37/1477; H01J 37/20; H01J 37/3171; H01J 2237/032; H01J 2237/0473; H01J 2237/20207
USPC ......... 250/453.11, 492.1, 492.2, 396 R, 397, 250/398, 400, 396 ML, 492.21, 492.22, 250/492.23
See application file for complete search history.

(56) References Cited

U.S. PATENT DOCUMENTS

| | | |
|---|---|---|
| 9,218,941 B2 | 12/2015 | Jen et al. |
| 9,305,784 B2 | 4/2016 | Ninomiya et al. |
| 9,601,314 B2 | 3/2017 | Ninomiya et al. |
| 2017/0248776 A1 | 8/2017 | Li et al. |

FOREIGN PATENT DOCUMENTS

| | | |
|---|---|---|
| JP | 07-078754 | 3/1995 |
| JP | 08-022799 | 1/1996 |
| JP | 08-055815 | 2/1996 |
| JP | 09-245722 | 9/1997 |

(Continued)

*Primary Examiner* — Nicole M Ippolito
*Assistant Examiner* — Hanway Chang
(74) *Attorney, Agent, or Firm* — Oblon, McClelland, Maier & Neustadt, L.L.P.

(57) ABSTRACT

In one embodiment, an ion implantation apparatus includes an ion source configured to generate an ion beam. The apparatus further includes a scanner configured to change an irradiation position with the ion beam on an irradiation target. The apparatus further includes a first electrode configured to accelerate an ion in the ion beam. The apparatus further includes a controller configured to change at least any of energy and an irradiation angle of the ion beam according to the irradiation position by controlling the ion beam having been generated from the ion source.

6 Claims, 19 Drawing Sheets

(56) References Cited

FOREIGN PATENT DOCUMENTS

| JP | 2014-049620 | 3/2014 |
|----|-------------|--------|
| JP | 5718169 B2 | 5/2015 |
| JP | 5767983 B2 | 8/2015 |
| JP | 2017-510023 | 4/2017 |
| JP | 2017-520023 | 7/2017 |

ION IMPLANTATION APPARATUS AND ION IMPLANTATION METHOD

CROSS REFERENCE TO RELATED APPLICATIONS

This application is based upon and claims the benefit of priority from the prior Japanese Patent Applications No. 2017-169742, filed on Sep. 4, 2017 and No. 2018-002898, filed on Jan. 11, 2018, the entire contents of which are incorporated herein by reference.

FIELD

Embodiments described herein relate to an ion implantation apparatus and an ion implantation method.

BACKGROUND

In recent years, implantation energy regions that involve different ion implantation energies have been formed in a wafer in manufacturing a three-dimensional memory and the like. In this case, it is general to alternately repeat first steps each forming a resist mask on the wafer and second steps each implanting the ions into the wafer, and adjust an ion source for each ion implantation to change the implantation energy. However, there is a problem that productivity of the ion implantation is lowered due to the adjustment of the ion source. A similar problem may arise in a case where implantation angle regions that involve different ion implantation angles are formed in the wafer.

DETAILED DESCRIPTION

Embodiments will now be explained with reference to the accompanying drawings.

In one embodiment, an ion implantation apparatus includes an ion source configured to generate an ion beam. The apparatus further includes a scanner configured to change an irradiation position with the ion beam on an irradiation target. The apparatus further includes a first electrode configured to accelerate an ion in the ion beam. The apparatus further includes a controller configured to change at least any of energy and an irradiation angle of the ion beam according to the irradiation position by controlling the ion beam having been generated from the ion source.

First Embodiment

Figure 1:
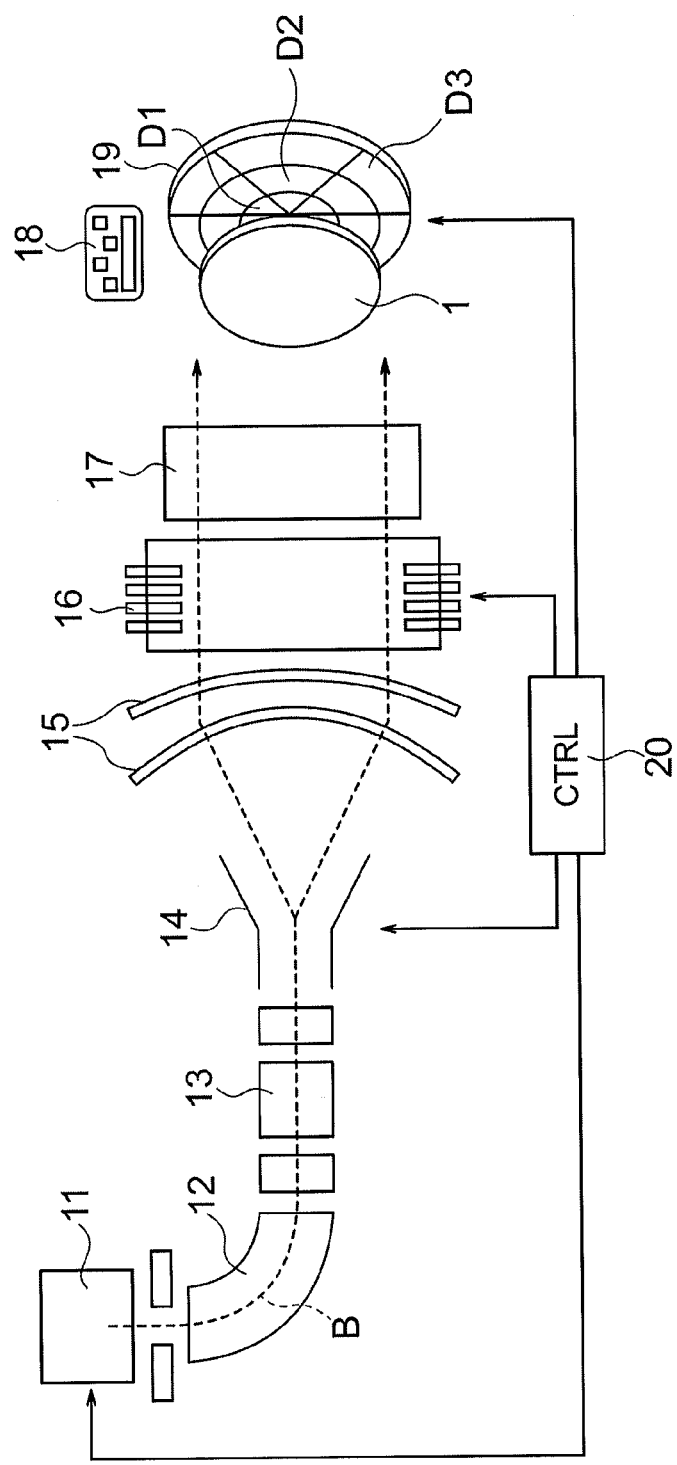
FIG. 1 is a schematic view illustrating a configuration of an ion implantation apparatus of a first embodiment.

FIG. 1 is a schematic view illustrating a configuration of an ion implantation apparatus of a first embodiment.

The ion implantation apparatus of FIG. 1 includes an ion source 11, an analyzer 12, a Q lens 13, a scanner 14, a parallel lens (P lens) 15, a post-acceleration electrode 16, an energy filter 17, a Faraday cup 18, a plurality of control electrodes 19, and a controller 20. The post-acceleration electrode 16 is an example of a first electrode, and the control electrodes 19 are an example of a second electrode.

The ion source 11 generates an ion beam denoted by a reference sign B. The analyzer 12 outputs ions having a predetermined mass and valence to the Q lens 13. The Q lens 13 narrows down the ion beam that has been expanded by the analyzer 12. The scanner 14 scans a wafer 1 with the ion beam by changing an irradiation position of the ion beam on the wafer 1. As a result, it is possible to irradiate the entire wafer 1 with the ion beam.

The parallel lens 15 makes the ion beam that has passed through the scanner 14 parallel to each other. The post-acceleration electrode 16 changes energy of the ion beam by accelerating ions in the ion beam. Here, acceleration of the ions includes not only a case where the acceleration of the ions is positive but also a case where the acceleration of the ions is negative. Further, the energy of the ion beam refers to energy of each the ions in the ion beam, and it is expressed, for example, in keV. The energy filter 17 outputs ions having the predetermined energy to the wafer 1. The Faraday cup 18 counts the ions in the ion beam.

In FIG. 1, a surface of the wafer 1 on the left is referred to as a front surface of the wafer 1, and a surface of the wafer 1 on the right is a back surface of the wafer 1. A direction perpendicular to the front surface of the wafer 1, i.e., a horizontal direction in FIG. 1, corresponds to a depth direction of the wafer 1. On the other hand, a direction parallel to the front surface of the wafer 1 corresponds to an in-plane direction of the wafer 1. The wafer 1 is housed inside a processing chamber, which is not illustrated, and the front surface of the wafer 1 is irradiated with the ion beam. The wafer 1 is a semiconductor wafer for instance and an example of an irradiation target.

The plurality of control electrodes 19 are provided on a side of a subsequent stage of the post-acceleration electrode 16, and more specifically, the plurality of control electrodes 19 are provided on a side of a back surface of the wafer 1. The control electrodes 19 change the energy of the ion beam by accelerating the ions in the ion beam.

In FIG. 1, 18 control electrodes 19 are illustrated as one example. The control electrodes 19, which are partitioned into 18 by three circles and three lines, are adjacent to each other in a direction parallel to the front surface of the wafer 1. Reference signs D1, D2, and D3 denote one control electrode 19 positioned inside of the first circle, one control electrode 19 positioned inside of the second circle, and one control electrode 19 positioned inside of the third circle, respectively. The control electrodes 19 have a disk shape as a whole and are disposed in parallel to the wafer 1. Note that the number of the control electrodes 19 may be other than 18.

The controller 20 controls various kinds of operation of the ion implantation apparatus. For example, the controller 20 controls generation of the ion beam by the ion source 11, scanning operation by the scanner 14, voltage of the post-acceleration electrode 16, voltage of the control electrodes 19, and the like. Examples of the controller 20 are a processor, an electric circuit, a computer, and the like.

By controlling the ion beam that has been generated from the ion source 11, the controller 20 changes the energy of the ion beam according to the irradiation position thereof. More specifically, by controlling voltages to be applied to the plurality of control electrodes 19 for each of the control electrodes 19, the controller 20 changes the energy of the ion beam according to the irradiation position thereof. The controller 20 is capable of independently controlling such voltage of each of the control electrodes 19.

For example, in a case where a positive voltage is applied to the control electrode 19 denoted by the reference sign D1, the positive ion beam is largely decelerated when irradiating a central region of the wafer 1, whereby the energy of the ion beam is decreased. As a result, in the central region of the wafer 1, ions are implanted shallowly. Note, however, that in a case where negative ions are used or where a negative voltage is applied to the control electrode 19, an opposite phenomenon occurs.

Figure 2:
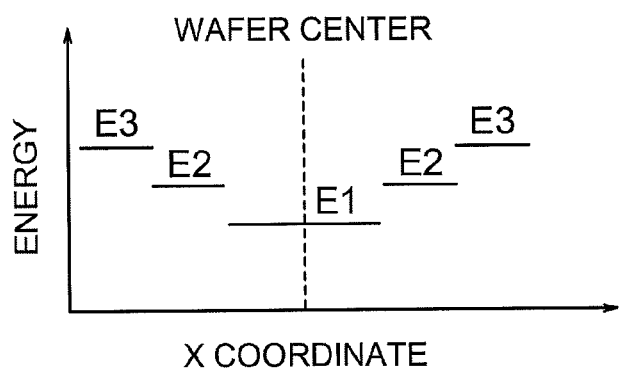
FIG. 2 is a graph illustrating operation of the ion implantation apparatus of the first embodiment.

FIG. 2 is a graph illustrating operation of an ion implantation apparatus of the first embodiment.

A horizontal axis of FIG. 2 represents an X coordinate parallel to the front surface of the wafer 1, and a vertical axis of FIG. 2 represents the energy of the ion beam. FIG. 2 illustrates one example of a relationship between an irradiation position of the ion beam and the energy of the ion beam on the front surface of the wafer 1.

In FIG. 2, the energy of the ion beam is set to E1 to E3. In this case, when the central region of the wafer 1 is irradiated with the ion beam, the energy of the ion beam is small, and ions are implanted shallowly. On the other hand, when a peripheral region of the wafer 1 is irradiated with the ion beam, the energy of the ion beam is large, and ions are implanted deeply. In this case, a low voltage is applied to the control electrode 19 denoted by the reference sign D1 while a high voltage is applied to the control electrode 19 denoted by the reference sign D3.

Figure 3:
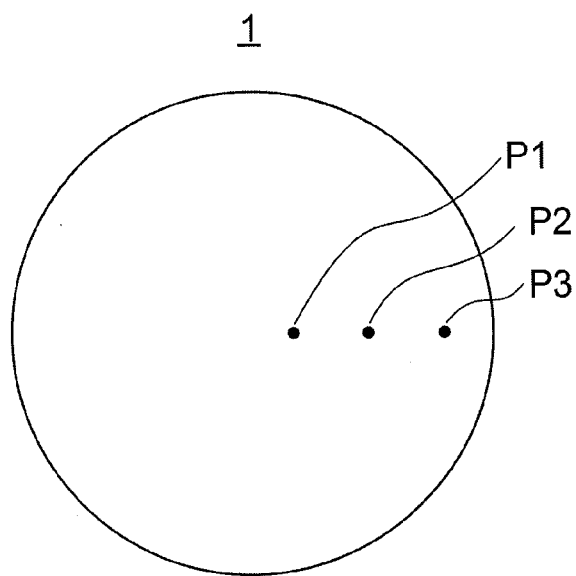
FIG. 3 is a view complementing descriptions of FIG. 2.

FIG. 3 is a view complementing descriptions of FIG. 2.

FIG. 3 illustrates points P1 to P3 on the front surface of the wafer 1. In the above example, the points P1 to P3 are respectively irradiated with the ion beams having energy E1 to E3. As a result, at the point P1, ions are shallowly implanted while at the point P3, ions are deeply implanted.

Figure 4:
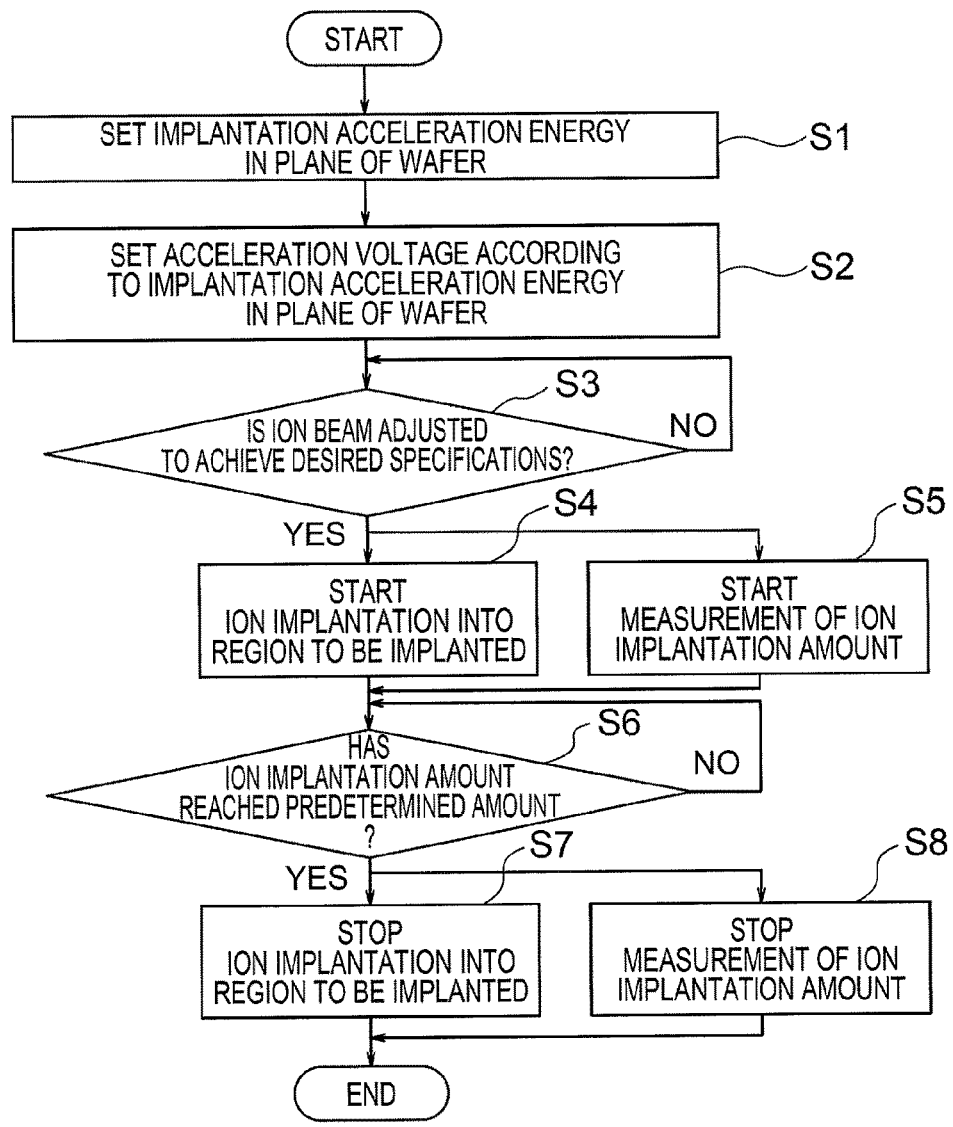
FIG. 4 is a flowchart illustrating the operation of the ion implantation apparatus of the first embodiment.

FIG. 4 is a flowchart illustrating operation of the ion implantation apparatus of the first embodiment.

First, the controller 20 sets implantation acceleration energy of each region in a plane of the wafer 1 (step S1). Next, according to the implantation acceleration energy that has been set, the controller 20 sets an acceleration voltage to be applied to the post-acceleration electrode 16 and an acceleration voltage to be applied to each of the control electrodes 19 (step S2).

Next, by adjusting the ion source 11, the controller 20 adjusts a state of the ion beam to achieve desired specifications (step S3). Next, the controller 20 starts ion implantation into each region to be implanted (step S4) and starts measurement of an ion implantation amount (step S5).

Next, once the ion implantation amount into each of the regions to be implanted reaches a predetermined amount (step S6), the controller 20 stops the ion implantation (step S7) and stops the measurement of the ion implantation amount (step S8). Accordingly, the ion implantation into the wafer 1 is completed.

Figure 5:
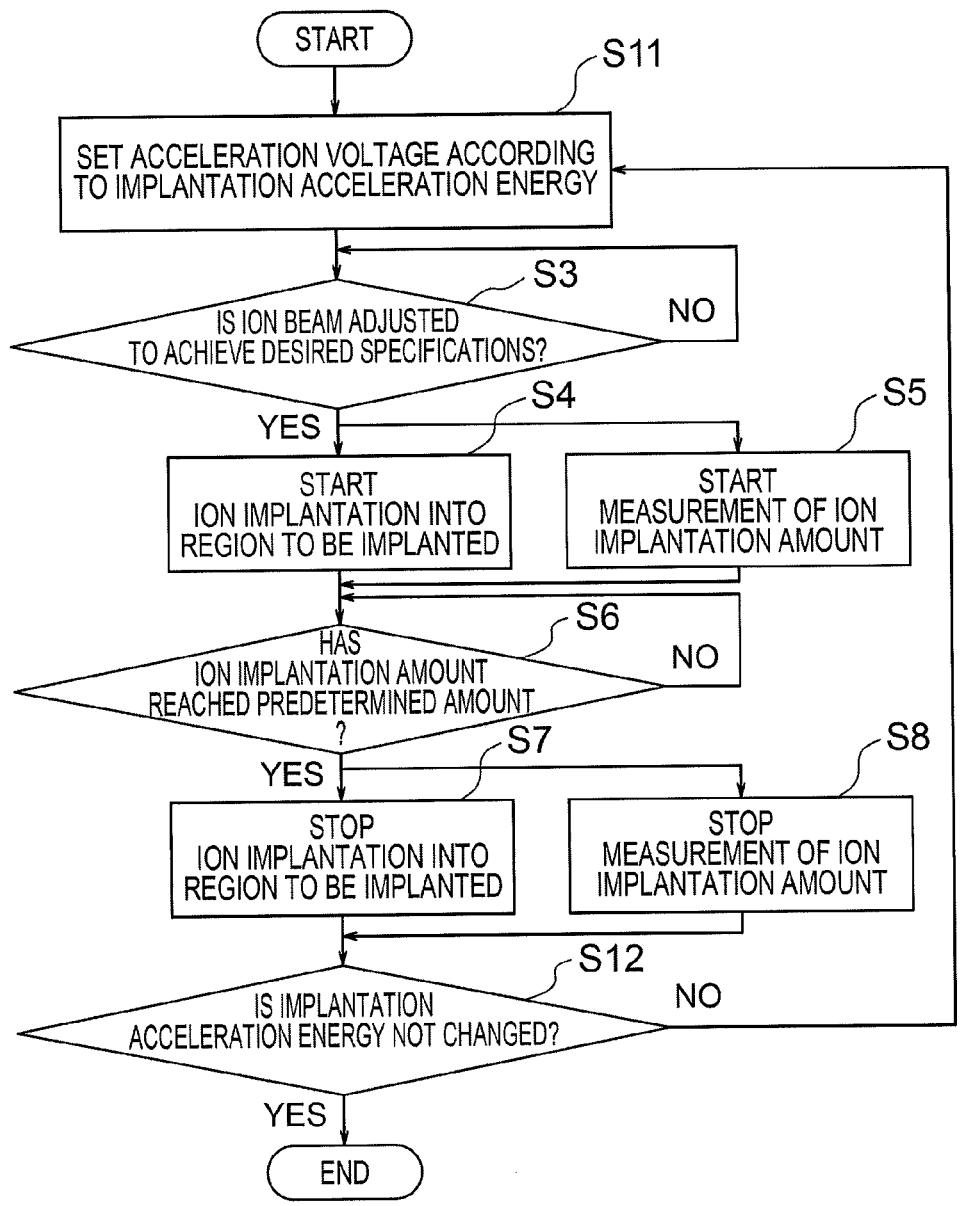
FIG. 5 is a flowchart illustrating operation of an ion implantation apparatus of a comparative example of the first embodiment.

FIG. 5 is a flowchart illustrating operation of an ion implantation apparatus of a comparative example of the first embodiment. The ion implantation apparatus of the comparative example is not provided with the control electrode 19.

First, before irradiating a certain region to be implanted with the ion beam, the controller 20 sets an acceleration voltage to be applied to the post-acceleration electrode 16 according to the implantation acceleration energy of this region to be implanted (step S11).

Next, by adjusting the ion source 11, the controller 20 adjusts a state of the ion beam to achieve desired specifications (step S3). Next, the controller 20 starts the ion implantation into this region to be implanted (step S4) and starts measurement of the ion implantation amount (step S5).

Next, once the ion implantation amount into this region to be implanted reaches a predetermined amount (step S6), the controller 20 stops the ion implantation (step S7) and stops the measurement of the ion implantation amount (step S8). Accordingly, the ion implantation into this region to be implanted is completed.

Next, before irradiating the next region to be implanted with the ion beam, the controller 20 determines whether or not changing of the implantation acceleration energy is necessary (step S12). In a case where the changing of the implantation acceleration energy is necessary, after step S11 is executed, steps S3 to S8 are executed again. In a case where the changing of the implantation acceleration energy is not necessary, step S11 is omitted, and steps S3 to S8 are executed again.

Accordingly, in this comparative example, it is necessary to adjust the ion source 11 each time the region to be implanted is changed. Therefore, productivity of the ion implantation is lowered due to adjustment of the ion source 11.

On the other hand, in this embodiment, it is not necessary to adjust the ion source 11 each time the region to be implanted is changed. Accordingly, according to this embodiment, it is possible to reduce an operational loss of the ion implantation apparatus due to the adjustment time of the ion source 11, whereby it is possible to form a plurality of implantation energy regions in a short time. Further, in this embodiment, in a case where a problem arises in the ion implantation, it can be easily dealt with by adjusting the voltage of the control electrode 19. Accordingly, according to this embodiment, it is possible to suppress characteristic variations of a semiconductor device as well as to improve yield of the semiconductor device.

As above, the controller 20 changes the energy of the ion beam according to the irradiation position thereof by controlling the ion beam that has been generated from the ion source 11. More specifically, by controlling the voltages to be applied to the plurality of control electrodes 19 for each of the control electrodes 19, the controller 20 changes the energy of the ion beam according to the irradiation position thereof. Accordingly, it is possible to easily form the plurality of implantation energy regions according to this embodiment.

Second Embodiment

Figure 6:
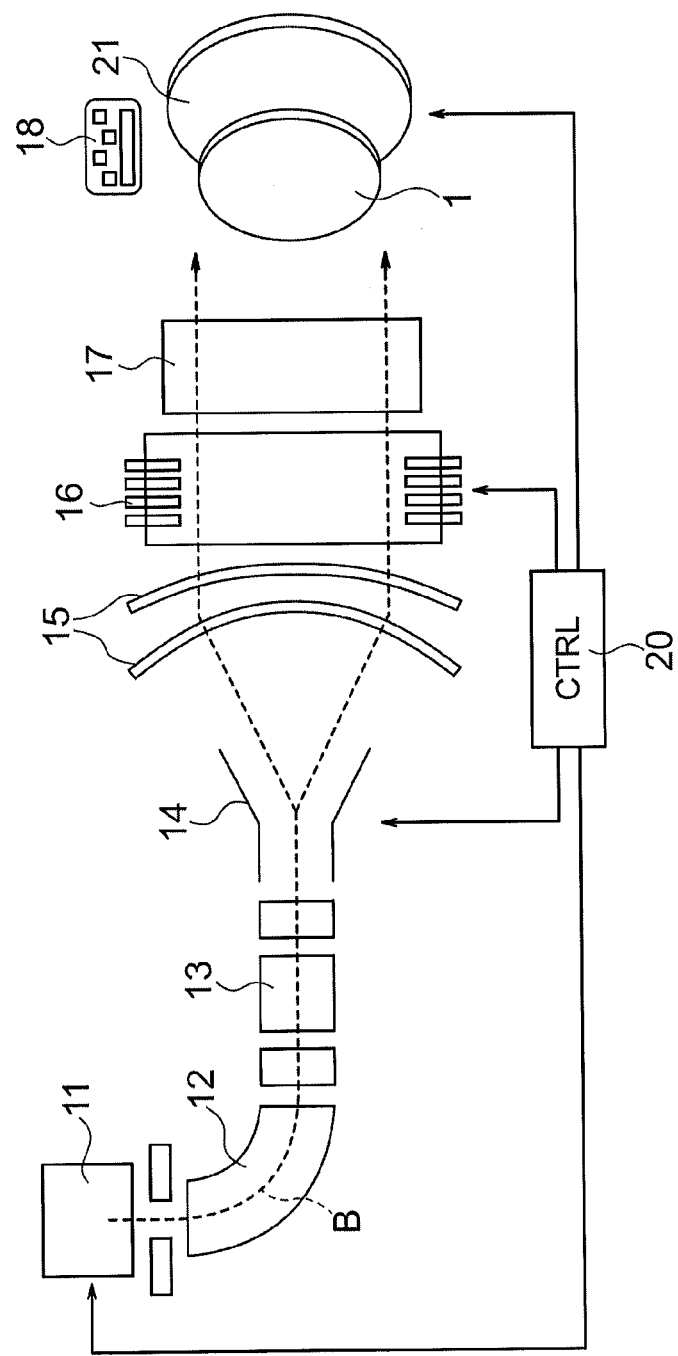
FIG. 6 is a schematic view illustrating a configuration of an ion implantation apparatus of a second embodiment.

FIG. 6 is a schematic view illustrating a configuration of an ion implantation apparatus of a second embodiment.

The ion implantation apparatus of FIG. 6, as an example of the second electrode, is provided with a single control electrode 21 in place of the plurality of control electrodes 19.

The control electrode 21 is provided on a side of a subsequent stage of the post-acceleration electrode 16, and more specifically, the control electrode 21 is provided on a side of a back surface of the wafer 1. The control electrode 21 changes the energy of the ion beam by accelerating the ions in the ion beam. The control electrode 21 has a disk shape and is disposed in parallel to the wafer 1.

In the same way as that the first embodiment, by controlling the ion beam that has been generated from the ion source 11, the controller 20 of this embodiment changes the energy of the ion beam according to the irradiation position thereof. Note, however, that by controlling a voltage to be applied to the control electrode 21 and a scanning speed of the ion beam by the scanner 14, the controller 20 of this embodiment changes the energy of the ion beam according to the irradiation position thereof. Accordingly, it is possible to form the plurality of implantation energy regions involving different ion implantation energies in the wafer 1.

Figure 7A:
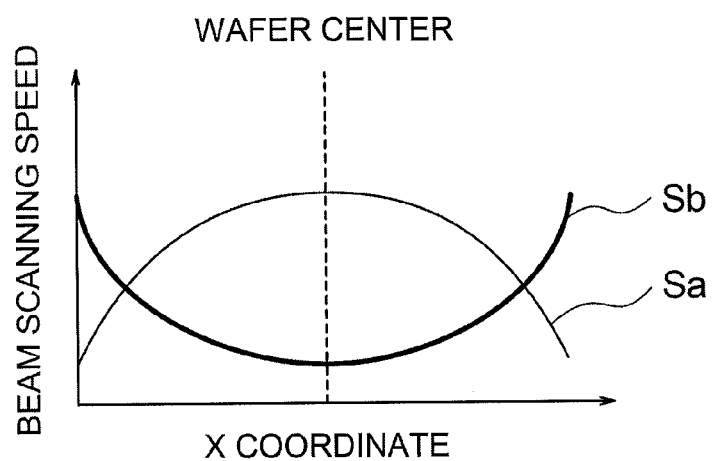
FIGS. 7A and 7B are graphs illustrating operation of the ion implantation apparatus of the second embodiment.
Figure 7B:
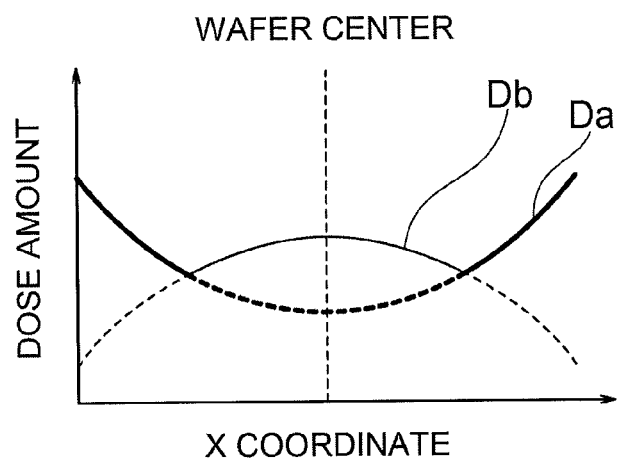

FIGS. 7A and 7B are graphs illustrating operation of the ion implantation apparatus of the second embodiment.

A horizontal axis in FIG. 7A represents an X coordinate parallel to the front surface of the wafer 1, and a vertical axis in FIG. 7A represents the scanning speed of the ion beam. In this embodiment, the wafer 1 is scanned twice with the ion beam. A curved line Sa indicates the scanning speed during a first scan, and a curved line Sb indicates the scanning speed during a second scan. During the first scan, the central region of the wafer 1 is scanned at a high speed, and during the second scan, the central region of the wafer 1 is scanned at a low speed.

A horizontal axis in FIG. 7B represents an X coordinate parallel to the front surface of the wafer 1, and a vertical axis in FIG. 7B represents a dose amount of the ion beam. A curved line Da indicates the dose amount of the ion beam during the first scan, and a curved line Db indicates the dose amount of the ion beam during the second scan.

During the first scan, the central region of the wafer 1 is scanned at a high speed. Therefore, the ion beam that enters the central region of the wafer 1 is accelerated by the post-acceleration electrode 16 and the control electrode 21 for a short time. As a result, the dose amount of the ion beam in the central region of the wafer 1 is low as indicated by the curved line Da.

On the other hand, during the second scan, the central region of the wafer 1 is scanned at a low speed. Therefore, the ion beam that enters the central region of the wafer 1 is accelerated by the post-acceleration electrode 16 and the control electrode 21 for a long time. As a result, the dose amount of the ion beam in the central region of the wafer 1 is high as indicated by the curved line Db.

The curved line Da is illustrated in a broken line in the central region of the wafer 1 and is illustrated in a solid line in the peripheral region of the wafer 1. On the other hand, the curved line Db is illustrated in a broken line in the central region of the wafer 1 and is illustrated in a broken line in the peripheral region of the wafer 1. This indicates that in the central region of the wafer 1, the ion implantation by the second scan is dominant while in the peripheral region of the wafer 1, the ion implantation by the first scan is dominant. According to this example, it is possible to form the implantation energy region involving high energy in the central region and the peripheral region of the wafer 1 as well as to form the implantation energy region involving low energy between the central region and the peripheral region thereof.

In this embodiment, it is possible to adjust magnitude of an influence of the first scan and magnitude of an influence of the second scan by the voltage to be applied to the control electrode 21 or the post-acceleration electrode 16. For example, by setting the voltage of the control electrode 21 high during the first scan and by setting the voltage of the control electrode 21 low during the second scan, the influence of the first scan is increased compared to the influence of the second scan.

As above, the controller 20 changes the energy of the ion beam according to the irradiation position thereof by controlling the ion beam that has been generated from the ion source 11. More specifically, by controlling the voltage to be applied to the control electrode 21 and the scanning speed of the ion beam by the scanner 14, the controller 20 changes the energy of the ion beam according to the irradiation position thereof. Accordingly, it is possible to easily form the plurality of implantation energy regions according to this embodiment.

Third Embodiment

Figure 8:
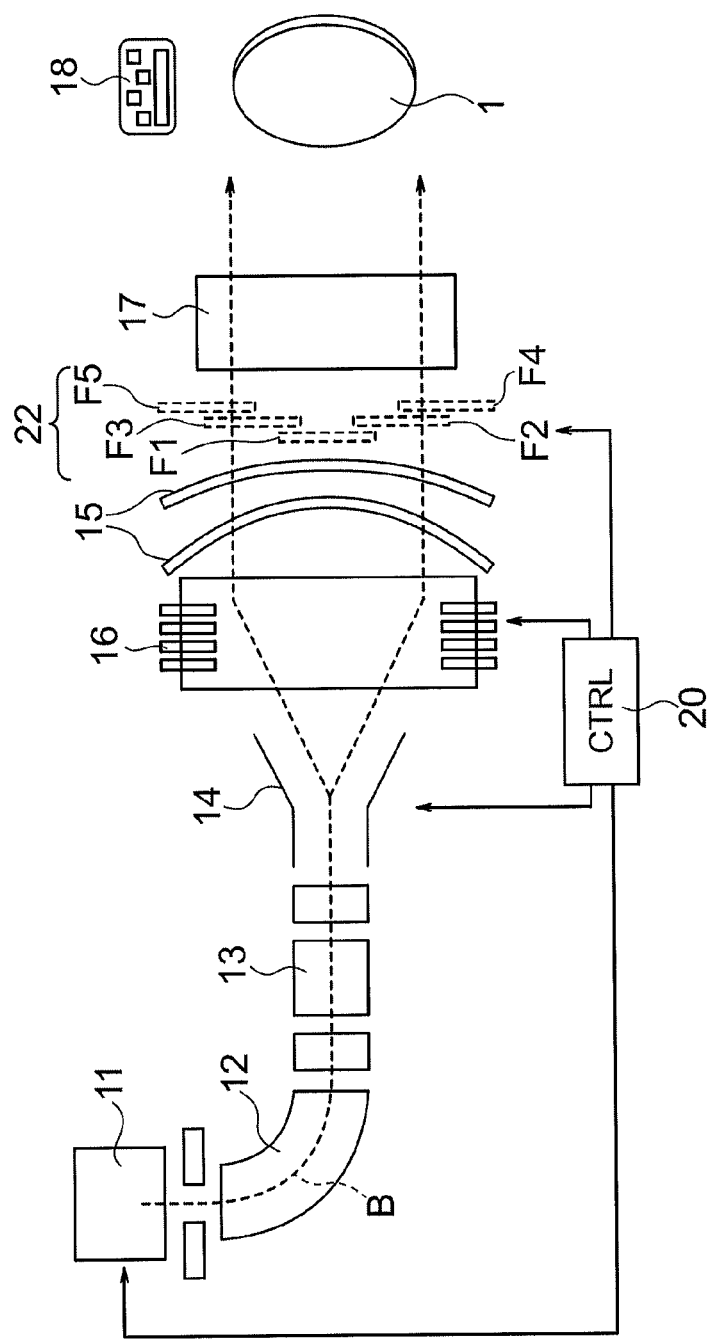
FIG. 8 is a schematic view illustrating a configuration of an ion implantation apparatus of a third embodiment.

FIG. 8 is a schematic view illustrating a configuration of an ion implantation apparatus of a third embodiment.

The ion implantation apparatus of FIG. 8, as an example of the second electrode, is provided with a plurality of control electrodes 22 in place of the plurality of control electrodes 19.

The plurality of control electrodes 22 is provided on a side of a subsequent stage of the post-acceleration electrode 16, and more specifically, the control electrodes 22 are provided between the post-acceleration electrode 16 and the energy filter 17. The control electrodes 22 change the energy of the ion beam by accelerating ions in the ion beam. Further, the parallel lens 15 of this embodiment is disposed between the post-acceleration electrode 16 and the control electrodes 22, and the parallel lens 15 makes the ion beam that has passed through the post-acceleration electrode 16 parallel to each other.

In FIG. 8, as one example, the control electrodes 22 denoted by reference signs F1 to F5 are illustrated. The control electrodes 22 are disposed in a direction parallel to the front surface of the wafer 1 so as to be shifted from each other. Each of the control electrodes 22 is configured to be movable in this direction and is also configured such that a width thereof can be varied in this direction. Accordingly, it is possible to move distributions of E1 to E3 illustrated in FIG. 2 in an X direction as well as to change a width in the X direction of each of the distributions. Examples of a planar shape of each of the control electrodes 22 are a round shape, an annular shape, a square, a rectangle, and the like. Further, the planar shape of each of the control electrodes 22 may also be a shape that is a division of the round shape as D1 described above or a shape that is a division of the annular shape as D2 and D3 described above.

For example, in a case where a high voltage is applied to the control electrode 22 denoted by the reference sign F1, the ion beam reaches final energy at a position of this control electrode 22. On the other hand, in a case where the high voltage is applied to the control electrodes 22 denoted by the reference signs F4 and F5, the ion beam reaches the final energy downstream of the control electrode 22 denoted by the reference sign F1. In this case, since the ion beam that passes through the electrode denoted by the reference sign F1 corresponding to the central region of the wafer is accelerated to the final energy on an upstream side, an influence of neutralization is reduced, and a low-energy component becomes smaller. On the other hand, the ion beam that passes through the electrode denoted by the reference signs F4 and F5 corresponding to an outer periphery region of the wafer includes many components that are neutralized before being accelerated to the final energy and are turned into low energy, whereby the energy of ions that is implanted into the outer periphery region of the wafer becomes relatively low compared to that implanted into the central region.

Accordingly, similar to the first embodiment, it is possible to form the plurality of implantation energy regions according to this embodiment.

Fourth Embodiment

Figure 9:
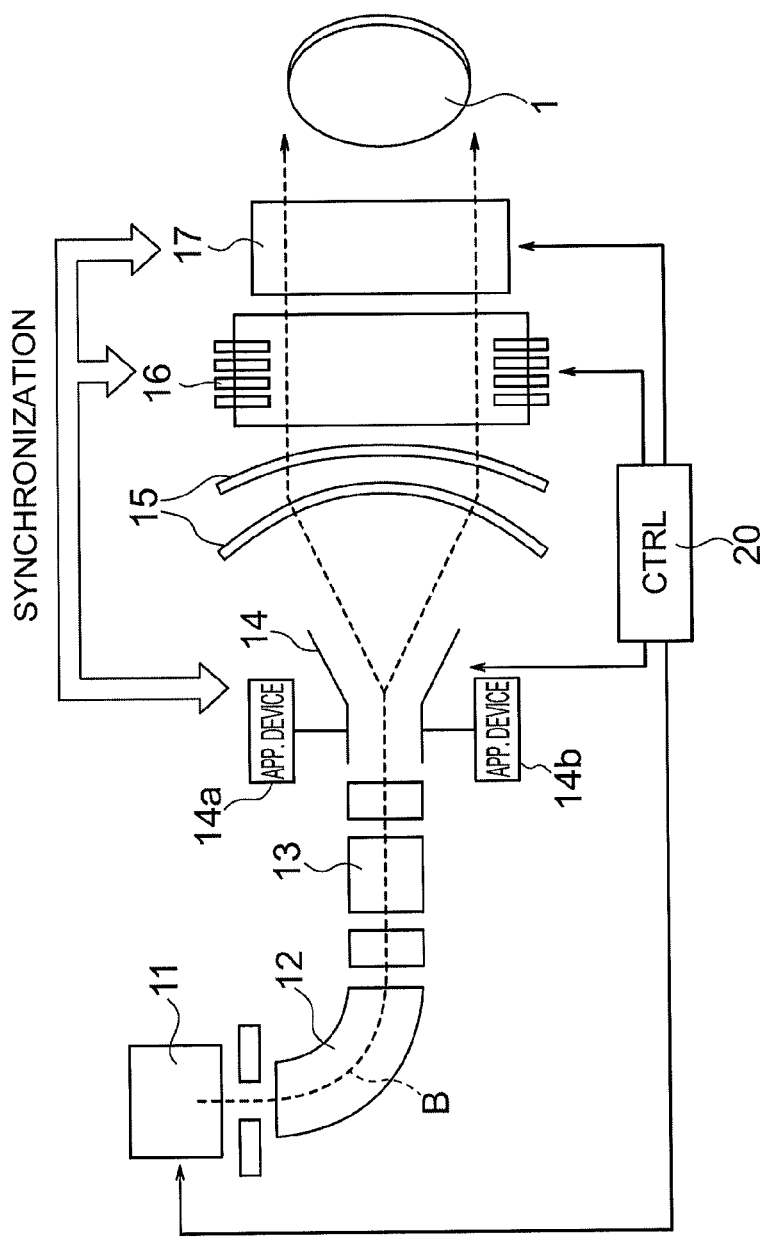
FIG. 9 is a schematic view illustrating a configuration of an ion implantation apparatus of a fourth embodiment.

FIG. 9 is a schematic view illustrating a configuration of an ion implantation apparatus of a fourth embodiment.

The controller 20 of this embodiment changes the energy of the ion beam according to an irradiation position thereof. More specifically, the controller 20 changes the energy of the ion beam according to the irradiation position thereof by synchronizing acceleration of ions by the post-acceleration electrode 16 with a change of the irradiation position by the scanner 14. Accordingly, it is possible to form the plurality of implantation energy regions involving different ion implantation energies in the wafer 1. The controller 20 further synchronizes operation of the energy filter 17 with operation of the post-acceleration electrode 16 and the scanner 14.

FIG. 9 further illustrates scanning voltage application devices 14a and 14b constituting the scanner 14, and a detail thereof is described below.

Figure 10:
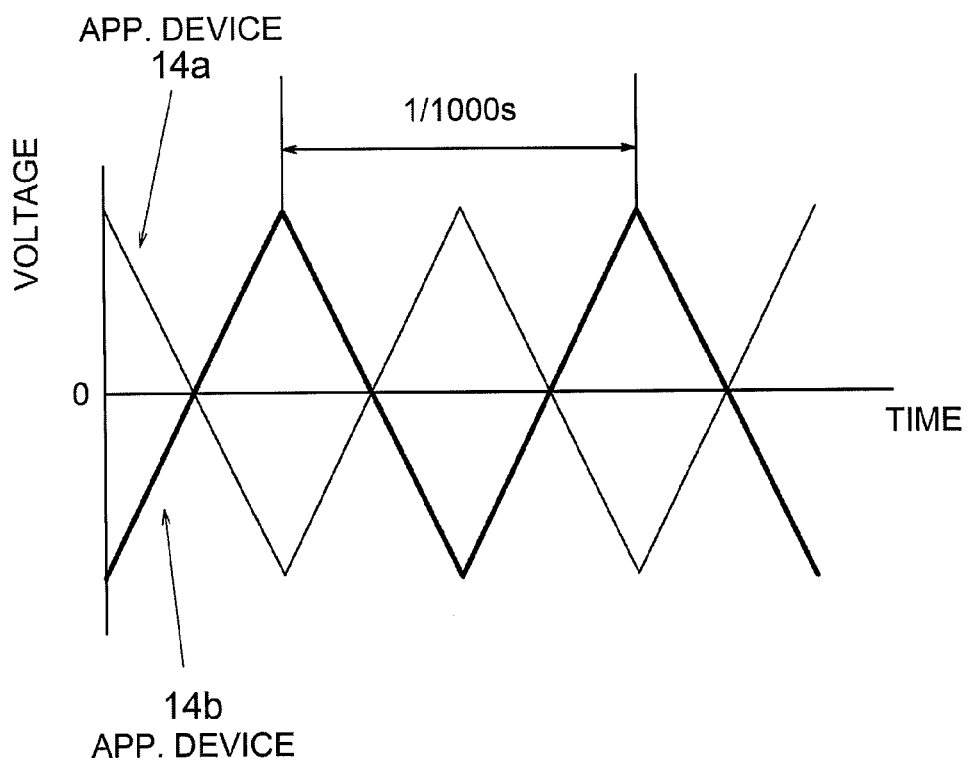
FIG. 10 is a graph illustrating operation of scanning voltage application devices of FIG. 9.

FIG. 10 is a graph illustrating operation of the scanning voltage application devices 14a and 14b of FIG. 9.

FIG. 10 illustrates a voltage output from the scanning voltage application device 14a and a voltage output from the scanning voltage application device 14b. These voltages change in a predetermined cycle of one several hundredth seconds to one several thousandth seconds, for example, in a cycle of one thousandth seconds. When the voltage from the scanning voltage application device 14a is positive, the ion beam receives repulsive force from the scanning voltage application device 14a, and when the voltage from the scanning voltage application device 14a is negative, the ion beam receives attracting force from the scanning voltage application device 14a. Similarly, when the voltage from the scanning voltage application device 14b is positive, the ion beam receives repulsive force from the scanning voltage application device 14b, and when the voltage from the scanning voltage application device 14b is negative, the ion beam receives attracting force from the scanning voltage application device 14b. As a result, the irradiation position of the ion beam changes in the cycle of one thousandth seconds.

Figure 11A:
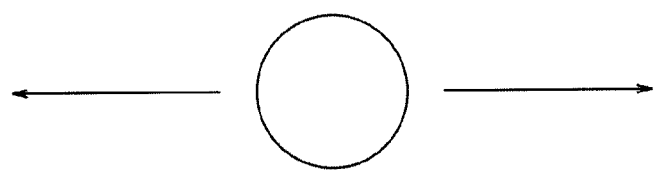
FIGS. 11A and 11B are views illustrating the operation of the scanning voltage application devices of FIG. 9.
Figure 11B:
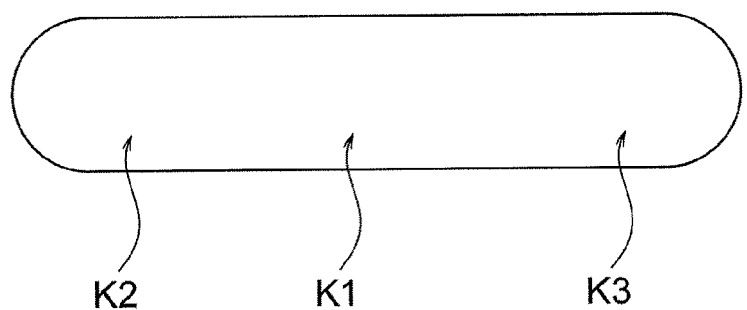

FIGS. 11A and 11B are views illustrating operation of the scanning voltage application devices 14a and 14b of FIG. 9.

FIG. 11A illustrates a sectional shape of the ion beam (spot beam) that enters the scanner 14. A position of the ion beam changes as arrows illustrated in FIG. 11A when passing through the scanner 14. That is, the position of the ion beam vibrates in the cycle of one thousandth seconds along a predetermined direction. The predetermined direction refers to a direction from the scanning voltage application device 14a toward the scanning voltage application device 14b and is a direction parallel to the X direction described below.

FIG. 11B illustrates a sectional region through which the ion beam passes in one thousandth seconds. The central region of the wafer 1 is irradiated with the ion beam that passes through a position of a reference sign K1, and the peripheral region of the wafer 1 is irradiated with the ion beam that passes through positions of reference signs K2 and K3.

In synchronization with the position of the ion beam, the controller 20 changes a voltage to be applied to the post-acceleration electrode 16 and a voltage to be applied to the energy filter 17. For example, when the ion beam passes through the position of the reference sign K1, a high voltage is applied to the post-acceleration electrode 16 and the energy filter 17. As a result, ions are implanted deeply into the central region of the wafer 1. On the other hand, when the ion beam passes through the positions of the reference signs K2 and K3, a low voltage is applied to the post-acceleration electrode 16 and the energy filter 17. As a result, ions are implanted shallowly into the peripheral region of the wafer 1.

Figure 12A:
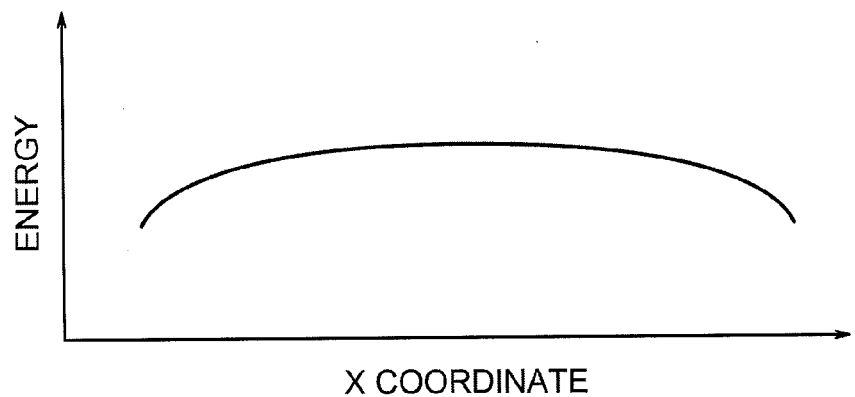
FIGS. 12A and 12B are graphs illustrating operation of the ion implantation apparatus of the fourth embodiment.
Figure 12B:
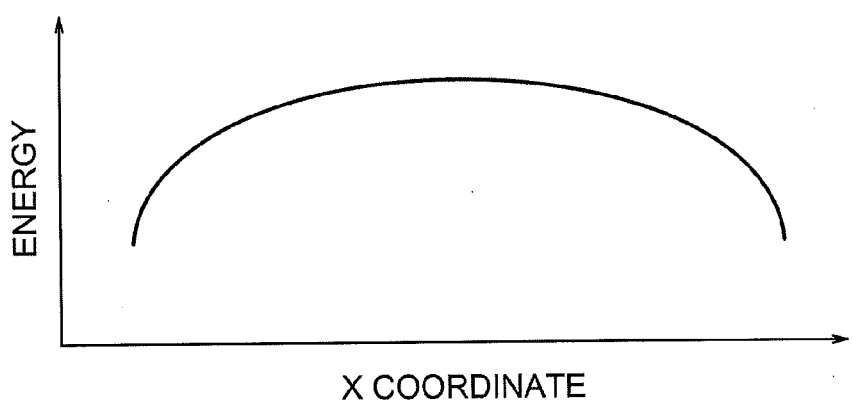

FIGS. 12A and 12B are graphs illustrating operation of the ion implantation apparatus of the fourth embodiment.

In FIG. 12A and FIG. 12B, a horizontal axis represents an X coordinate parallel to the front surface of the wafer 1, and a vertical axis represents the energy of the ion beam. Note, however, that in FIG. 12A, a Y coordinate represents an energy distribution on a line Y1, and in FIG. 12B, a Y coordinate represents the energy distribution on a line Y2, which is different from Y1. The Y coordinate is a coordinate axis parallel to the front surface of the wafer 1 and perpendicular to the X coordinate. According to this embodiment, through such control, it is possible to set a two-dimensional energy distribution of the ion beam.

As above, the controller 20 changes the energy of the ion beam according to the irradiation position thereof by controlling the ion beam that has been generated from the ion source 11. More specifically, the controller 20 changes the energy of the ion beam according to the irradiation position thereof by synchronizing acceleration of ions by the post-acceleration electrode 16 with a change of the irradiation position by the scanner 14. Accordingly, it is possible to easily form the plurality of implantation energy regions according to this embodiment.

Note that the scanner 14 of this embodiment changes the position of the ion beam according to an electric field; however, it is also possible to change it according to a magnetic field.

Fifth Embodiment

Figure 13:
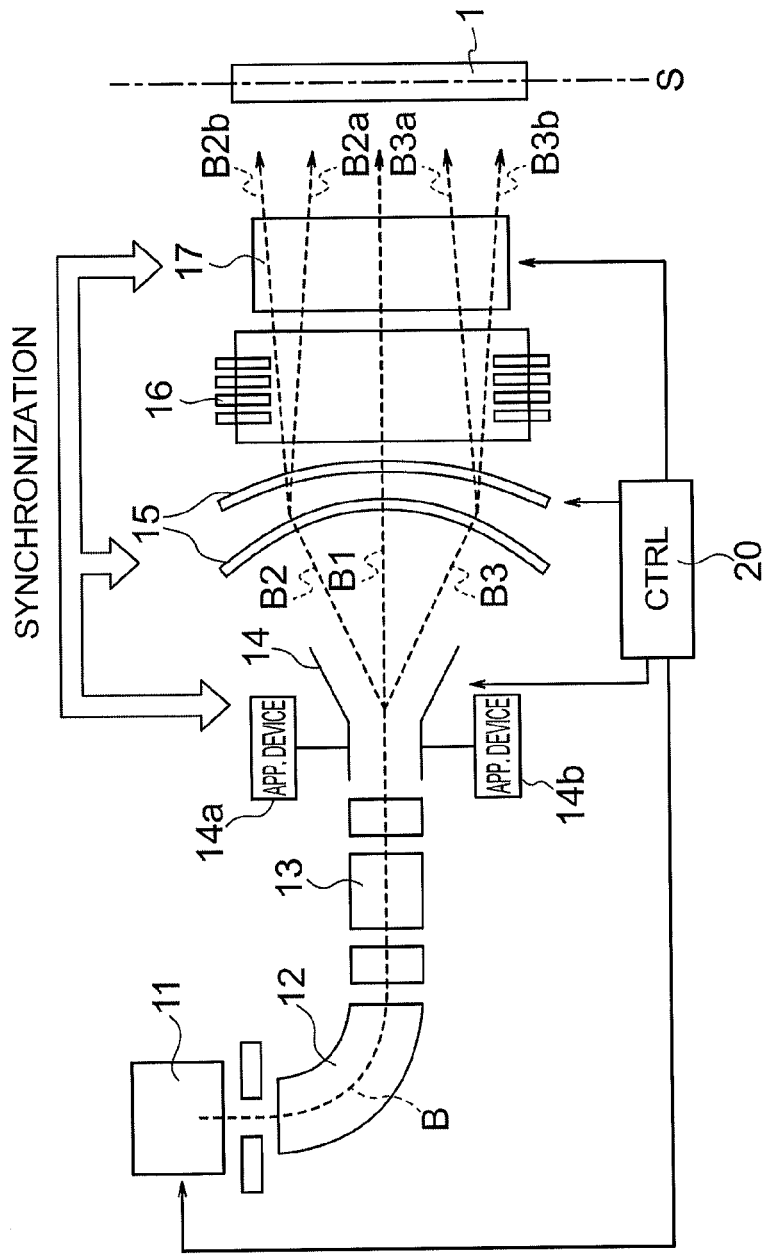
FIG. 13 is a schematic view illustrating a configuration of an ion implantation apparatus of a fifth embodiment.

FIG. 13 is a schematic view illustrating a configuration of an ion implantation apparatus of a fifth embodiment.

The controller 20 of this embodiment changes an irradiation angle of the ion beam according to the irradiation position thereof. More specifically, by synchronizing application of a voltage to the parallel lens 15 with a change of the irradiation position by the scanner 14, the controller 20 changes the irradiation angle of the ion beam according to the irradiation position thereof. Accordingly, it is possible to form the plurality of implantation angle regions involving different ion implantation angles in the wafer 1.

In FIG. 13, beams B1 to B3 are illustrated as examples of the ion beam entering the parallel lens 15. A reference sign S in FIG. 13 denotes a surface parallel to the front surface of the wafer 1. The beam B1 enters the wafer 1 such that an irradiation angle thereof is perpendicular to the surface S. On the other hand, as denoted by a reference sign B2a (or B2b), the beam B2 enters the wafer 1 such that the irradiation angle thereof is tilted against the surface S. Similarly, as denoted by a reference sign B3a (or B3b), the beam B3 enters the wafer 1 such that the irradiation angle thereof is tilted against the surface S. Accordingly, in this embodiment, the irradiation angle of the ion beam changes according to the irradiation position.

Figure 14A:
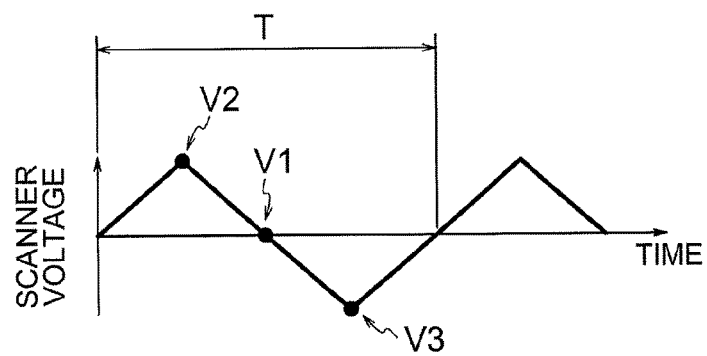
FIGS. 14A to 14C are graphs illustrating control of a parallel lens of FIG. 13.
Figure 14B:
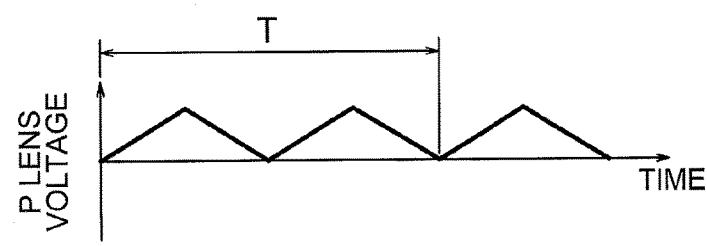
Figure 14C:
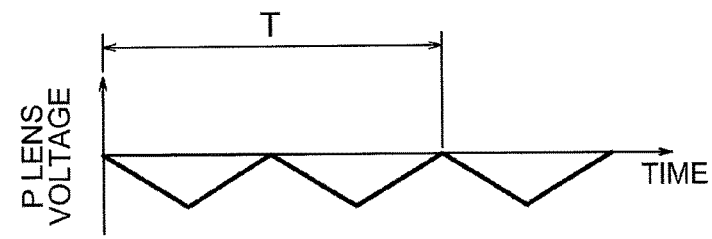

FIGS. 14A to 14C are graphs illustrating control of the parallel lens 15 of FIG. 13.

FIG. 14A illustrates a voltage (scanner voltage) to be applied to the scanner 14, and more specifically, it illustrates a voltage output from the scanning voltage application device 14a (see FIG. 10). A relationship between the voltage output from the scanning voltage application device 14a and the voltage output from the scanning voltage application device 14b is the same as that in FIG. 10. A reference sign T denotes a cycle of the scanner voltage. Reference signs V1, V2, and V3 respectively denote the scanner voltages when the beams B1, B2, and B3 pass through the scanner 14 in FIG. 13.

FIG. 14B and FIG. 14C respectively illustrate a first example and a second example of a voltage (P lens voltage) to be applied to the parallel lens 15. In both examples, one cycle of a change in the scanner voltage corresponds to two cycles of a change in the P lens voltage, whereby both changes are synchronized to each other. Accordingly, it is possible to synchronize the application of the voltage to the parallel lens 15 with the change of the irradiation position by the scanner 14.

Figure 15A:
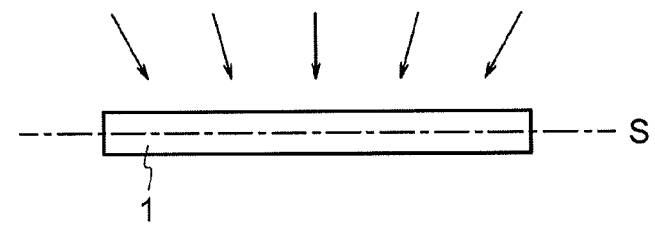
FIGS. 15A to 15C are views complementing descriptions of FIGS. 14A to 14C.
Figure 15B:
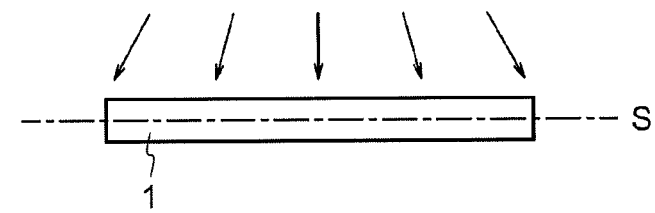
Figure 15C:
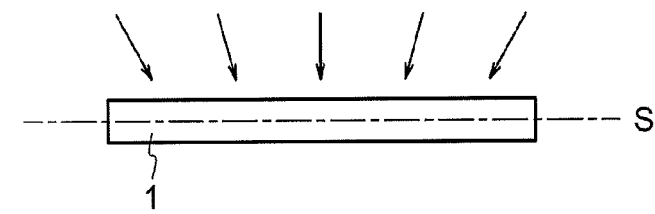

FIGS. 15A to 15C are views complementing descriptions of FIGS. 14A to 14C.

In the first example of FIG. 14B, orbits of the beams B2 and B3 respectively change as the reference signs B2a and B3a in FIG. 13. As a result, the ion beam enters the wafer 1 as in FIG. 15A. In this case, the ion beam enters the central region of the wafer 1 at a low angle and enters the peripheral region of the wafer 1 at a high angle and being tilted inwardly.

In the second example of FIG. 14C, the orbits of the beams B2 and B3 respectively change as the reference signs B2b and B3b in FIG. 13. As a result, the ion beam enters the wafer 1 as in FIG. 15B. In this case, the ion beam enters the central region of the wafer 1 at a low angle and enters the peripheral region of the wafer 1 at a high angle being tilted outwardly.

These examples are used, for example, to allow the ion beam to enter the wafer 1 in a tilted manner. For example, in a case where halo is implanted below a transistor on the wafer 1, it is possible to easily implant the halo below the transistor by using both the first example and the second example. Further, in a case where ions are implanted into a memory cell of a three-dimensional memory, by using the first example or the second example, it is possible to suitably implant the ions into the memory cell having a large aspect ratio.

Note that in the first and second examples, an incidence angle of the ion beam relative to the wafer 1 is the minimum (zero degrees) at the center of the wafer 1 and is the maximum at an outer edge (bevel) of the wafer 1. Here, an incidence angle of the ion beam is an angle of a traveling direction of the ion beam relative to a normal line of the surface S. The incidence angle at the outer edge of the wafer 1 according to this embodiment is equal to or smaller than thirty degrees and is, for example, about one degree to ten degrees.

It is noted that the ion beam may enter the wafer 1 to be symmetric about the center of the wafer 3 like FIGS. 15A and 15B, or may enter the wafer 1 to be asymmetric about the center of the wafer 3 like FIG. 15C.

As above, the controller 20 changes the irradiation angle of the ion beam according to the irradiation position thereof by controlling the ion beam that has been generated from the ion source 11. Accordingly, it is possible to easily form the plurality of implantation angle regions according to this embodiment.

Sixth Embodiment

Figure 16:
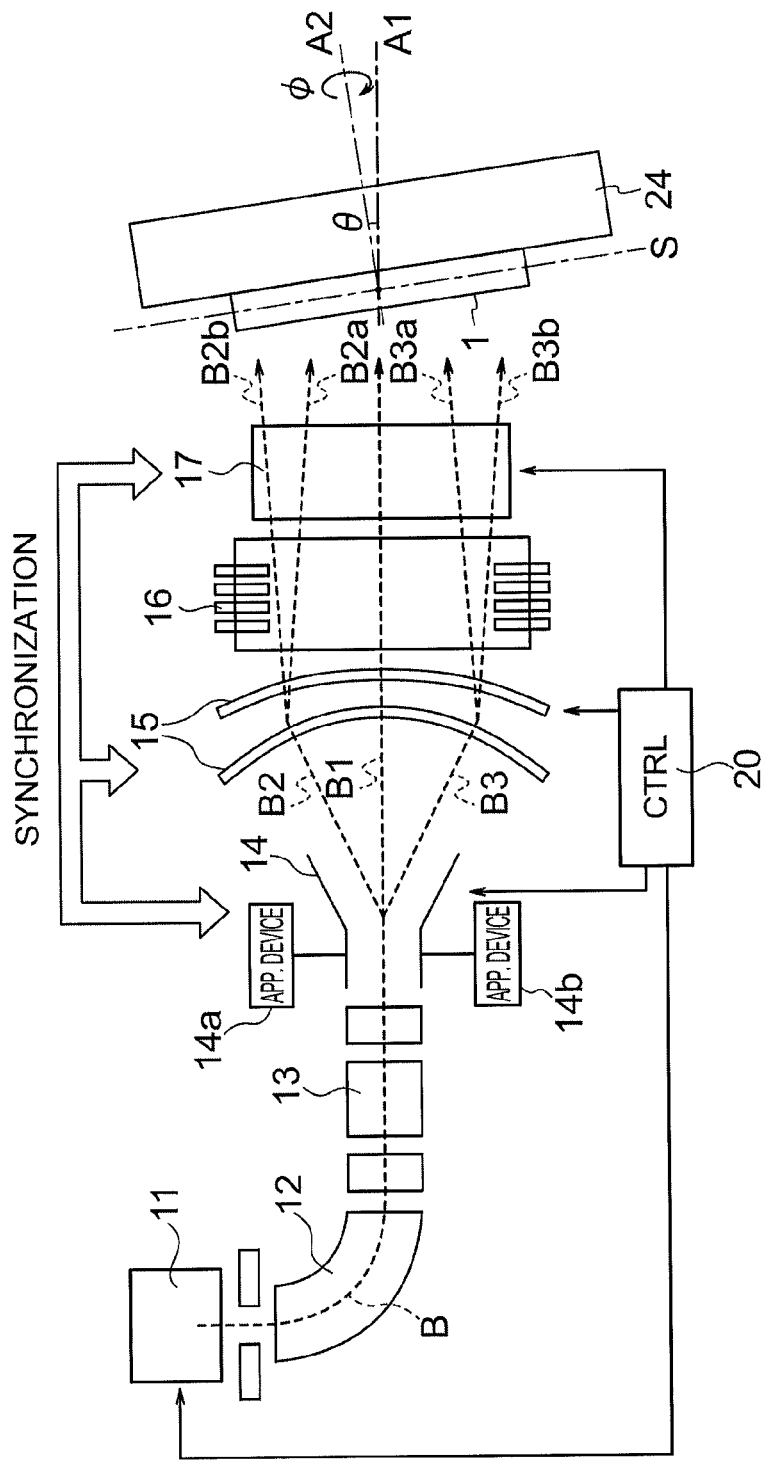
FIG. 16 is a schematic view illustrating a configuration of an ion implantation apparatus of a sixth embodiment.

FIG. 16 is a schematic view illustrating a configuration of an ion implantation apparatus of a sixth embodiment.

In addition to a constituent element illustrated in FIG. 13, the ion implantation apparatus of FIG. 16 is provided with a platen 24 holding the wafer 1 and being capable of changing a tilt angle θ of the wafer 1. The platen 24 is one example of a holder.

The tilt angle θ corresponds to an angle of inclination of the wafer 1 relative to the scanner 14, the parallel lens 15, the post-acceleration electrode 16, the energy filter 17, and the like. Reference signs A1 and A2 respectively denote a central axis of the platen 24 in a case where the tilt angles are zero and θ. The ion implantation apparatus of this embodiment is also capable of changing a twist angle φ of the wafer 1 by rotating the platen 24 about the central axis.

In this embodiment, the tilt angle θ and the twist angle φ are changed by the controller 20 by controlling the platen 24; however, it is also possible to allow a user of the ion implantation apparatus to manually change the angles.

Figure 17A:
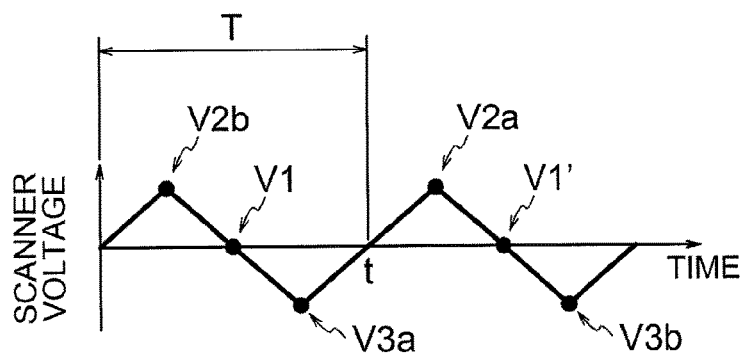
FIGS. 17A and 17B are graphs illustrating control of a parallel lens of FIG. 16.
Figure 17B:
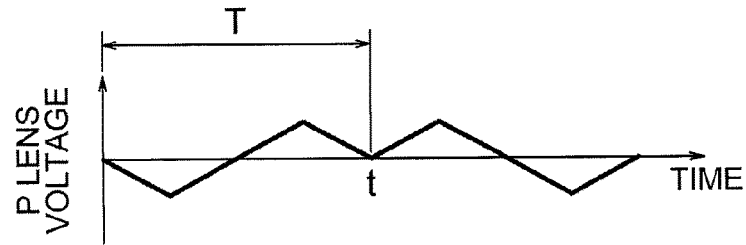

FIGS. 17A and 17B are graphs illustrating control of the parallel lens 15 of FIG. 16.

FIG. 17A illustrates a voltage (scanner voltage) to be applied to the scanner 14, and more specifically, it illustrates a voltage output from the scanning voltage application apparatus 14a. Details of FIG. 17A are the same as in FIG. 14A. Reference signs V2a, V2b, V3a, and V3b denote the scanner voltages corresponding to the beam B2a and beams B2b, B3a, and B3b in FIG. 16, respectively. Reference signs V1 and V1' each indicates the scanner voltage corresponding to the beam B1 of FIG. 16.

FIG. 17B illustrates an example of the voltage (P lens voltage) to be applied to the parallel lens 15. The P lens voltage in this example indicates a change similar with FIG. 14B and FIG. 14C; however, a phase of the P lens voltage instantaneously changes by 180 degrees at a time t. The P lens voltage in this example repeats such instantaneously phase change every time T. Accordingly, it is possible to alternately change the orbit of the beam B2 between B2a and B2b as well as to alternately change the orbit of the beam B3 between B3a and B3b.

According to this embodiment, by setting the tilt angle θ to an angle other than zero and by controlling the scanner voltage and the P lens voltage as in this example, it is possible to allow the ion beam to enter the central region of the wafer 1 at a high angle and to enter the peripheral region of the wafer 1 at a low angle. Further, by changing the phase of the P lens voltage every time T instantaneously by 180 degrees, it is possible to change an incidence direction of the ion beam from inward to outward or from outward to inward in each region of the wafer 1. Such control is applied, for example, in a case where halo is implanted below the transistor on the wafer 1.

Figure 18:
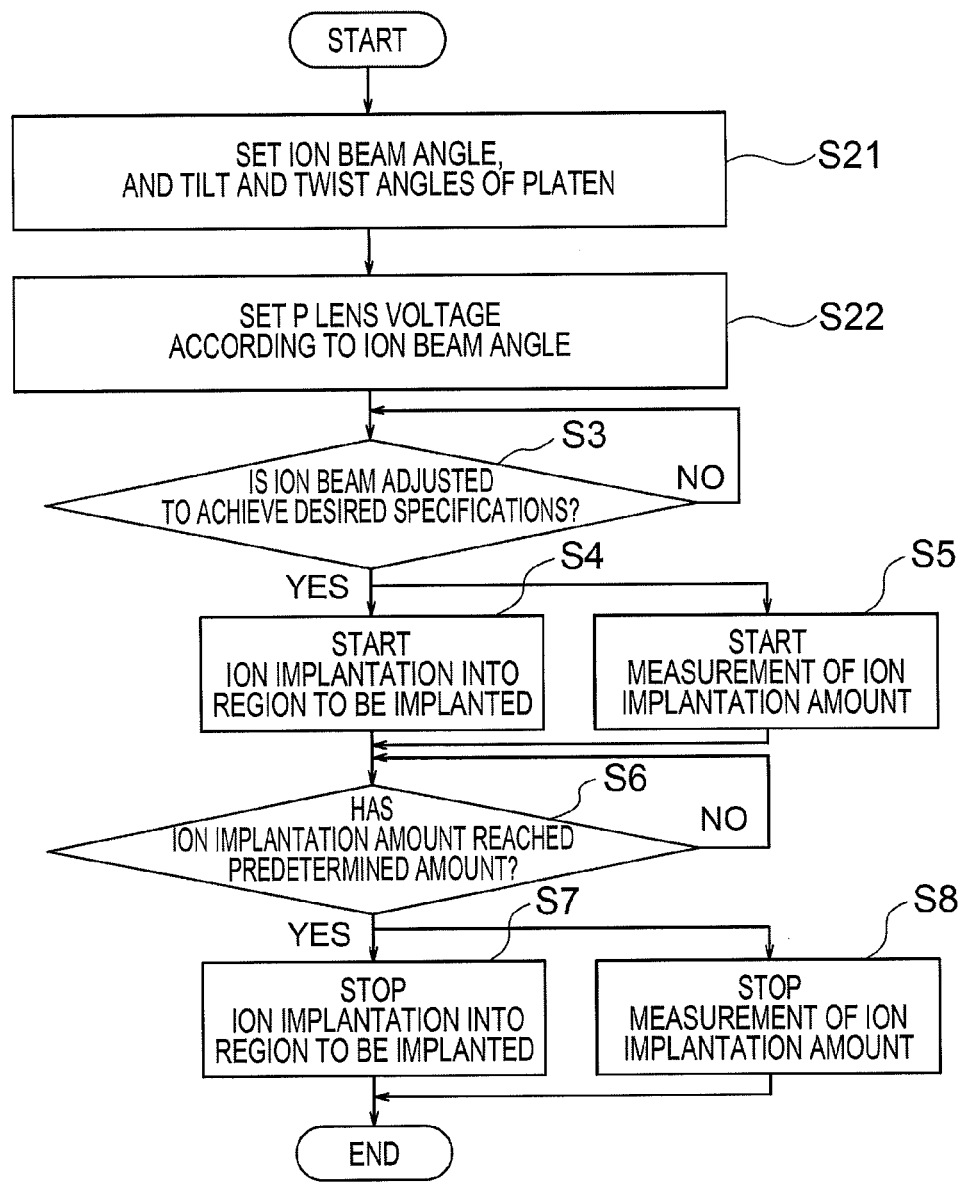
FIG. 18 is a flowchart illustrating operation of the ion implantation apparatus of the sixth embodiment.

FIG. 18 is a flowchart illustrating operation of the ion implantation apparatus of the sixth embodiment.

First, the controller 20 sets an ion beam angle for each in-plane region of the wafer 1 and sets the tilt angle θ and the twist angle φ of the wafer 1 (platen 24) (step S21). Next, according to the ion beam angle that has been set, the controller 20 sets a voltage to be applied to the parallel lens 15 (step S22).

Next, by adjusting the ion source 11, the controller 20 adjusts a state of the ion beam to achieve desired specifications (step S3). Next, the controller 20 starts ion implantation into each region to be implanted (step S4) and starts measurement of an ion implantation amount (step S5).

Next, once the ion implantation amount into each of the regions to be implanted reaches a predetermined amount (step S6), the controller 20 stops the ion implantation (step S7) and stops the measurement of the ion implantation amount (step S8). Accordingly, the ion implantation into the wafer 1 is completed.

Figure 19:
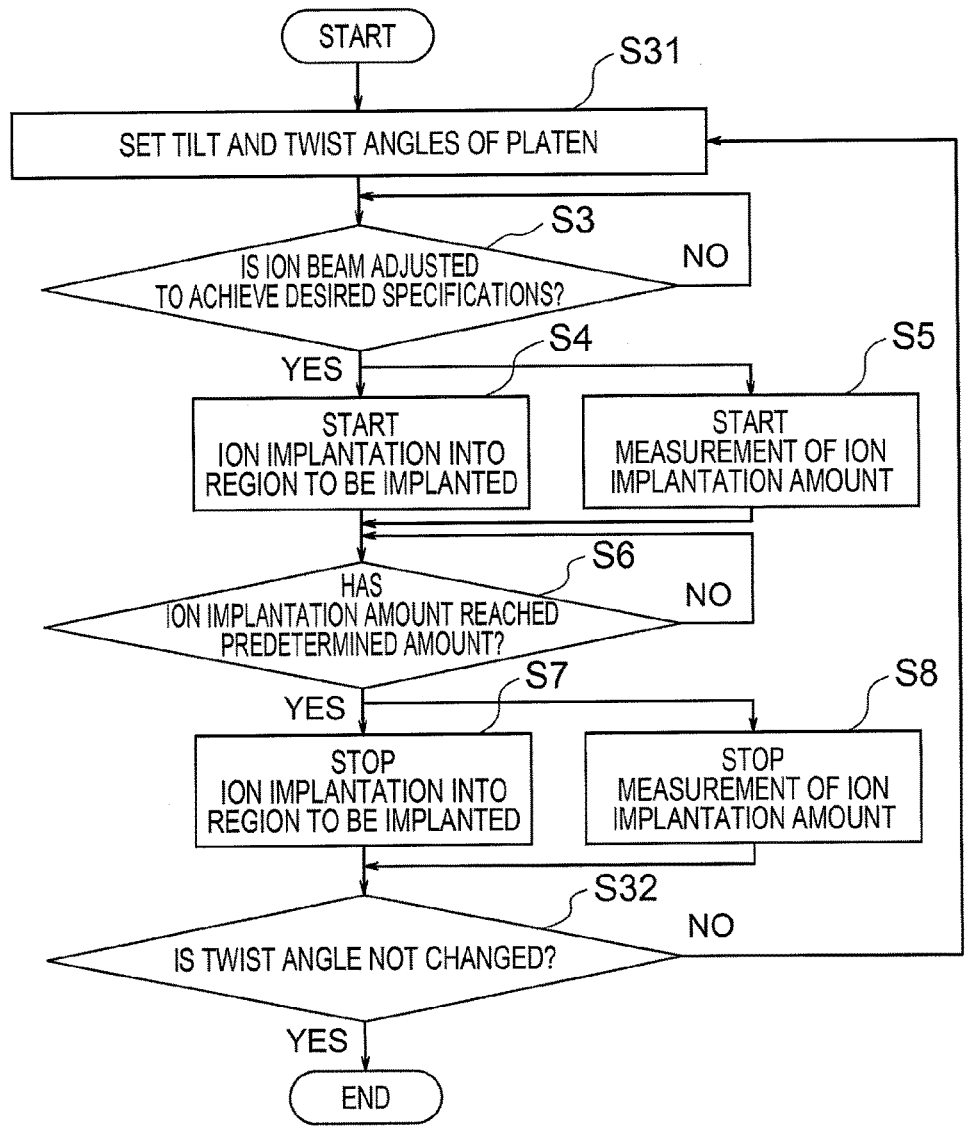
FIG. 19 is a flowchart illustrating operation of an ion implantation apparatus of a comparative example of the sixth embodiment.

FIG. 19 is a flowchart illustrating operation of an ion implantation apparatus of a comparative example of the sixth embodiment.

First, before irradiating a certain region to be implanted with the ion beam, the controller 20 sets the tilt angle θ and the twist angle φ of the wafer 1 (platen 24) for the ion implantation into this region to be implanted (step S31).

Next, by adjusting the ion source 11, the controller 20 adjusts a state of the ion beam to achieve desired specifications (step S3). Next, the controller 20 starts the ion implantation into this region to be implanted (step S4) and starts measurement of the ion implantation amount (step S5).

Next, once the ion implantation amount into this region to be implanted reaches a predetermined amount (step S6), the controller 20 stops the ion implantation (step S7) and stops the measurement of the ion implantation amount (step S8). Accordingly, the ion implantation into this region to be implanted is completed.

Next, before irradiating the next region to be implanted with the ion beam, the controller 20 determines whether or not changing of the twist angle φ is necessary (step S32). In a case where the changing of the twist angle φ is necessary, after step S31 is executed, steps S3 to S8 are executed again. In a case where the changing of the twist angle φ is not necessary, step S31 is omitted, and steps S3 to S8 are executed again.

Accordingly, in this comparative example, it is necessary to adjust the platen 24 each time the region to be implanted is changed. Therefore, productivity of the ion implantation is lowered due to adjustment of the platen 24.

On the other hand, in this embodiment, it is not necessary to adjust the platen 24 each time the region to be implanted is changed. Accordingly, according to this embodiment, it is possible to reduce an operational loss of the ion implantation apparatus due to the adjustment time of the platen 24, whereby it is possible to form the plurality of implantation angle regions in a short time. Further, in this embodiment, in a case where a problem arises in the ion implantation, it can be easily dealt with by adjusting the voltage of the control electrode 19. Accordingly, according to this embodiment, it is possible to suppress characteristic variations of a semiconductor device as well as to improve yield of the semiconductor device.

As above, according to this embodiment, it is possible to change the irradiation angle of the ion beam by changing the parallel lens 15 and the platen 24. Accordingly, according to this embodiment, it is possible to improve flexibility of forming the plurality of implantation angle regions.

Seventh Embodiment

Figure 20:
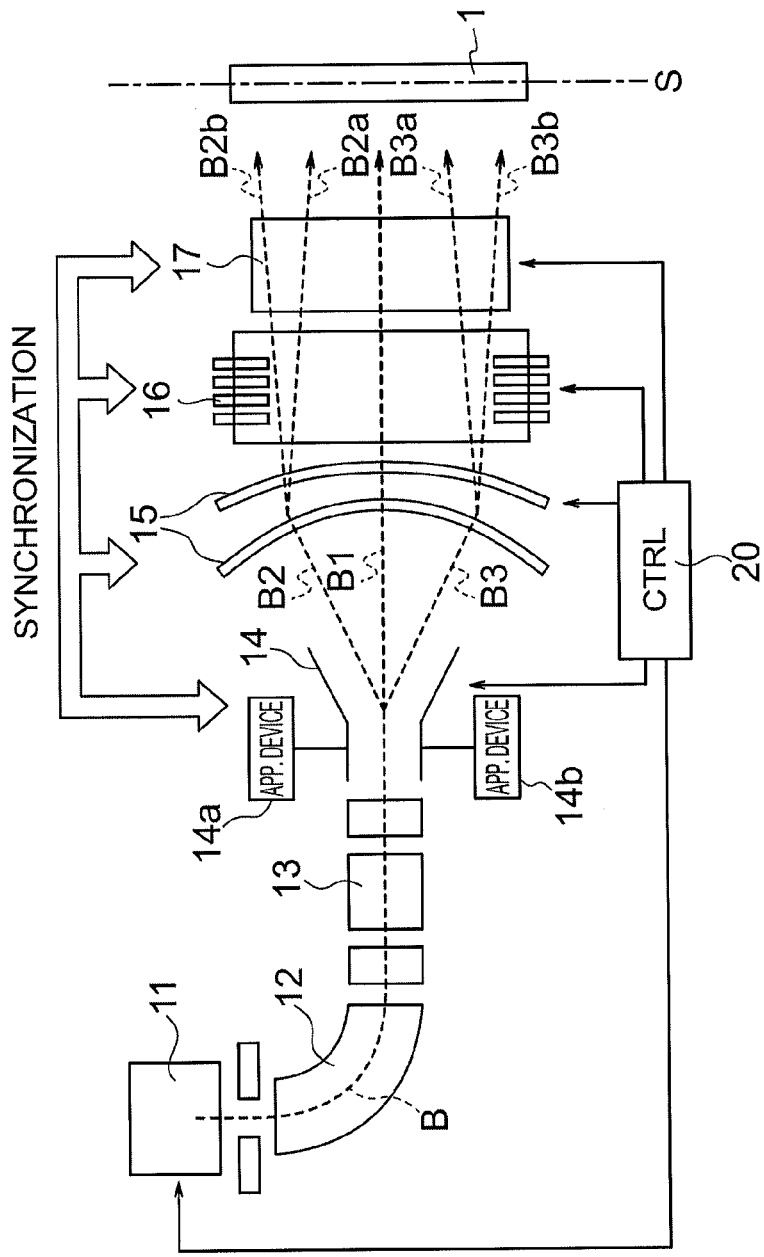
FIG. 20 is a schematic view illustrating a configuration of an ion implantation apparatus of a seventh embodiment.

FIG. 20 is a schematic view illustrating a configuration of an ion implantation apparatus of a seventh embodiment.

The ion implantation apparatus of FIG. 20 is configured so as to include both the function of the ion implantation apparatus of FIG. 9 and the function of the ion implantation apparatus of FIG. 13. More specifically, the controller 20 is capable of synchronizing the acceleration of ions by the post-acceleration electrode 16 with application of a voltage to the parallel lens 15 and a change of the irradiation position by the scanner 14.

Synchronization control according to this embodiment is applied to the following cases, for example.

As described above, by synchronizing the application of a voltage to the parallel lens 15 with the change of the irradiation position by the scanner 14, the controller 20 changes the irradiation angle of the ion beam according to the irradiation position thereof. Accordingly, it is possible to form the plurality of implantation angle regions involving different ion implantation angles in the wafer 1.

In this case, there is a problem in that by changing the voltage to be applied to the parallel lens 15 according to the irradiation position, the energy of the ion beam is also changed according to the irradiation position due to an effect of the parallel lens 15. Therefore, in order to cancel such energy change, the controller 20 accelerates ions by the post-acceleration electrode 16 in synchronization with the application of the voltage to the parallel lens 15 and the change of the irradiation position by the scanner 14. Accordingly, it is possible to solve the above-described problem.

Further, the synchronization control according to this embodiment may also be performed to actively use energy control by the post-acceleration electrode 16. That is, by this synchronization control, the controller may change both the energy and the irradiation angle of the ion beam according to the irradiation position. Accordingly, it is possible to form the plurality of implantation energy regions involving different ion implantation energies and the plurality of implantation angle regions involving different ion implantation angles in the wafer 1.

As above, the controller 20 controls the energy and the irradiation angle of the ion beam that has been generated from the ion source 11. Accordingly, it is possible to achieve more suitable ion implantation and more complicated ion implantation according to this embodiment.

Note, however, that the synchronization control according to this embodiment may also be applied in combination with control of the platen 24 of the sixth embodiment.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. An ion implantation apparatus comprising:
an ion source configured to generate an ion beam;
a scanner configured to change an irradiation position with the ion beam on an irradiation target;
a first electrode configured to accelerate an ion in the ion beam;
a plurality of second electrodes provided on a side of a subsequent stage of the first electrode, provided on a side of a back surface of the irradiation target, and configured to accelerate the ion in the ion beam; and
a controller configured to change energy of the ion beam according to the irradiation position by controlling the ion beam having been generated from the ion source,
wherein the controller changes the energy of the ion beam according to the irradiation position by controlling voltages to be applied to the plurality of second electrodes for each of the second electrodes.

2. The apparatus of claim 1, wherein the plurality of second electrodes are disposed to be adjacent to each other in a direction parallel to a front surface of the irradiation target.

3. An ion implantation apparatus comprising:
an ion source configured to generate an ion beam;
a scanner configured to change an irradiation position with the ion beam on an irradiation target;
a first electrode configured to accelerate an ion in the ion beam;
a second electrode provided on a side of a subsequent stage of the first electrode, provided on a side of a back surface of the irradiation target, and configured to accelerate the ion in the ion beam; and
a controller configured to change energy of the ion beam according to the irradiation position by controlling the ion beam having been generated from the ion source,
wherein the controller changes the energy of the ion beam according to the irradiation position by controlling a voltage to be applied to the second electrode and a scanning speed of the ion beam by the scanner.

4. An ion implantation method comprising:
generating an ion beam from an ion source;
changing, by a scanner, an irradiation position with the ion beam on an irradiation target;
accelerating an ion in the ion beam by a first electrode;
accelerating the ion in the ion beam by a plurality of second electrodes provided on a side of a subsequent stage of the first electrode and provided on a side of a back surface of the irradiation target; and
changing, by a controller, energy of the ion beam according to the irradiation position by controlling the ion beam having been generated from the ion source,
wherein the controller changes the energy of the ion beam according to the irradiation position by controlling voltages to be applied to the plurality of second electrodes for each of the second electrodes.

5. The method of claim 4, wherein the plurality of second electrodes are disposed to be adjacent to each other in a direction parallel to a front surface of the irradiation target.

6. An ion implantation method comprising:
generating an ion beam from an ion source;
changing, by a scanner, an irradiation position with the ion beam on an irradiation target;
accelerating an ion in the ion beam by a first electrode;
accelerating the ion in the ion beam by a second electrode provided on a side of a subsequent stage of the first electrode and provided on a side of a back surface of the irradiation target; and
changing, by a controller, energy of the ion beam according to the irradiation position by controlling the ion beam having been generated from the ion source,
wherein the controller changes the energy of the ion beam according to the irradiation position by controlling a voltage to be applied to the second electrode and a scanning speed of the ion beam by the scanner.

* * * * *